United States Patent [19]
Ohshima et al.

[11] Patent Number: 5,731,717
[45] Date of Patent: Mar. 24, 1998

[54] LOGIC OR MEMORY ELEMENT BASED ON N-STABLE PHASE-LOCKING OF SINGLE-ELECTRON TUNNELING OSCILLATION, AND COMPUTER USING THE SAME

[75] Inventors: Toshio Ohshima; Richard A. Kiehl, both of Kawasaki, Japan

[73] Assignee: Fujitsu Limited, Kawasaki, Japan

[21] Appl. No.: 628,352

[22] Filed: Apr. 5, 1996

[30] Foreign Application Priority Data

Apr. 6, 1995 [JP] Japan ................. 7-081579

[51] Int. Cl.$^6$ ................................................ H01L 29/92
[52] U.S. Cl. ........................................ 326/136; 257/30
[58] Field of Search ........................ 326/136; 257/14, 257/25, 30

[56] References Cited

U.S. PATENT DOCUMENTS

| | | | |
|---|---|---|---|
| 5,258,625 | 11/1993 | Kamohara et al. | 257/30 |
| 5,350,930 | 9/1994 | Schmid et al. | 257/14 |
| 5,548,129 | 8/1996 | Kubena | 257/25 |
| 5,646,559 | 7/1997 | Higurashi | 326/136 |

*Primary Examiner*—Edward P. Westin
*Assistant Examiner*—Benjamin D. Driscoll
*Attorney, Agent, or Firm*—Staas & Halsey

[57] ABSTRACT

A single-electron tunneling (SET) element used as a logic or memory element includes at least one tunneling junction with a minute metal-insulator-metal sandwich structure, and a biasing power source which is connected in series to the at least one tunneling junction and whose ON/OFF operation is controlled by an external control input. SET oscillations are generated in the at least one tunneling junction and the generated oscillations are phase-locked to subharmonics of a pump signal supplied from an AC power source, to thus exhibit a plurality of stable phase states. Also, a plurality of gates, each including the SET element, are constituted in the form of a logic network to realize a predetermined logic operation in a computer. In the logic network, an input signal with a frequency half that of the pump signal is continually applied to a specified gate among the plurality of gates, while the biasing power sources of all of the gates are kept in ON state. Alternatively, when the biasing power source of the specified gate is switched ON, the biasing power sources of all of a first group of gates providing inputs to the specified gate, and the biasing power sources of all of a second group of gates providing inputs to the first group of gates, are kept in ON state.

23 Claims, 20 Drawing Sheets

$$\begin{cases} S_n = A_n \cos(\omega_0 t + \phi_n) \\ 20 ; V_{ac} \cos(2\omega_0 t) \end{cases}$$

$$\begin{cases} S_n = A_n \cos(\omega_0 t + \phi_n) \\ 20 ; V_{ac} \cos(2\omega_0 t) \end{cases}$$

{ SOLID LINE··· OSC. SGL OF GATE $G_1$
BROKEN LINE··· OSC. SGL OF GATE $G_2$

CASE OF PHASE STATE OF "1"

CASE OF PHASE STATE OF "0"

CASE OF f=0.30

CASE OF f=0.95

CASE OF f=1.00

CASE OF f=1.70

LOGIC OR MEMORY ELEMENT BASED ON N-STABLE PHASE-LOCKING OF SINGLE-ELECTRON TUNNELING OSCILLATION, AND COMPUTER USING THE SAME

BACKGROUND OF THE INVENTION

1. Field of the Invention

This invention relates to a logic or memory element used as a basic element constituting a computer. More specifically, this invention relates to an element for accomplishing a plurality of stable phase states and having a Single-Electron Tunneling junction (hereinafter referred to as a "SET element"), and its applications.

2. Description of the Related Art

Conventional computers based on transistor switching devices such as CMOS FETs are limited in performance by fundamental scaling limitations. Because of these limitations, FET gate lengths cannot be scaled much below 0.1 [μm] and circuit speed and density cannot be improved beyond certain limits.

Also, computers based on other (non-transistor) types of devices have been proposed. Among the prior art references, the patent to Von Neumann (1957), for example, shows a parametric computer comprising a system of non-linear reactances driven by a pump signal at a multiple of the element frequency. Goto (1959) describes a similar computer concept based on a device called a "parametron".

The basic concepts of such computers are reviewed in an article by Wigington (1959). If an element with a frequency f0 is phase-locked to a pump signal at 2f0, the phase of the oscillation is bistable due to the indeterminate phase relationship between the oscillation and pump frequencies. The two phase states of the element are used to represent logic states. The state of the element may be selected by the application of an input signal at f0 with the pump signal turned off and then turning the pump signal on. Logic gates may be implemented by the combination of input signals. Other aspects of computation by this scheme such as the control of logic flow between elements by a three-phase clocking scheme, and so forth, are also reviewed by Wigington.

Another means for providing unidirectional logic flow for such computers, by introducing delay lines between successive elements in a chain, is described in the patent to Gunn (1969).

As also reviewed in the article by Wigington (1959), one general approach to realizing such an element is based on subharmonic generation at f0, which occurs when a nonlinear reactance is placed in a multiply-tuned circuit and driven by a high frequency pump signal at 2f0. If a suitable resonant circuit at f0 is provided and other conditions are met, such a nonlinear reactance subharmonic (NRS) element will exhibit a negative resistance at f0. The mechanism for this is a power transfer from the pump signal at 2f0 to f0 as governed by the Manley and Rowe relations (1956). As a result, oscillations will build up at f0 which are phase-locked with the pump signal.

Elements that have been proposed to serve as the nonlinear reactance in an NRS element include pn junction capacitors, ferrite core inductors, and Josephson junctions.

One example is the "Josephson device parametron" disclosed in the patent to Zappe (1975). In this patent, a bistable element is provided by an isolated Josephson junction pumped by an A.C. magnetic field. In the Zappe patent, the Josephson device itself serves as a resonant circuit in which oscillation can be built up at f0 by the application of the A.C. magnetic field at 2f0. In other words, the resonant circuit is effectively provided by the internal operation of the junction, rather than by external circuit elements. This results in a very small size, and a high frequency capability, when compared with elements based on discrete components.

Another example is the "D.C. flux parametron" proposed by Goto and Loe (1986). This device is operated in a manner similar to the conventional parametric computer, but uses the polarity of the D.C. flux, rather than an oscillation phase, to represent a logic state.

Conventional parametric computers have also been limited by the size of the elements, particularly the size of discrete reactive elements used to provide the required non-linear reactance and resonant circuit required for a NRS element. Power dissipation is also undesirably large in most parametric computers based on conventional elements.

Although some Josephson junctions based on conventional computers offer small size since they are based on an internal parametric action, Josephson devices have the disadvantage of requiring cryogenic operating temperatures. Josephson-based computers such as those proposed by the Zappe patent (1975) have the further disadvantage of requiring a high frequency A.C. magnetic field, which is difficult to realize in practice.

As discussed by Averin and Likharev (1993), single-electron charging effects in ultra-small tunneling junctions are known to provide a number of new types of behavior associated with the coulomb blockade phenomenon. A number of computer circuits using SET junctions have been proposed, including logic circuits analogous to conventional (pulse type) transistor circuits and logic circuits in which single digital bits are encoded by single electrons.

However, it is known that a SET junction can exhibit coherent oscillations as a result of the single-electron tunneling process. The frequency f0 of these oscillations is given by $f0 = I/e$ (where I is the D.C. current). Phase locking of the SET oscillation by an external A.C. signal has been predicted in computer simulations by Averin and Likharev (1986). This calculation indicates that, under certain conditions, phase locking may occur when f0 is either a harmonic or a subharmonic of the external signal. Coherent oscillation and phase locking have also been predicted for multiple (series connected) junctions.

The prior art has not discussed the use of bistability in phase-locked SET oscillations and has not at all discussed the use of SET oscillations as the basis of a parametric computer analogous to Von Neumans parametric computer.

<References>

J. Von Neumann, U.S. Pat. No. 2,815,488, Dec. 3, 1957 K.

F. Loe and E. Goto, DC Flux Parametron, Series in Computer Science, Vol. 6, World Scientific, Singapore, 1986

R. L. Wigington, Proc. IRE, 516 (1959)

J. B. Gunn, U.S. Pat. No. 3,433,974, Mar. 18, 1969

H. H. Zappe, U.S. Pat. No. 3,863,078, Jan. 28, 1975

H. Tamura, S. Haruo and Y. Okabe, Appl. Phys. Lett. 62,1909 (1987)

J. Kadlec and K. H. Gundlach, J. Low Temp. Phys. 27,887 (1977)

D. V. Averin and K. K. Likharev, in Mesoscopic Phenomena in Solids, edited by B. L. Altshhuler, P. A. Lee and R. A. Webb, Modern Problems in Condensed Matter Sciences Vol. 30, (Elsevier Science, Netherlands, 1991) P. 173

SUMMARY OF THE INVENTION

It is a main object of the present invention to provide a SET element capable of contributing to the configuration of a novel computer which is not subject to scaling limitations and the limitations in the operating speed of conventional transistor computers or conventional parametric computers.

It is another object of the present invention to provide various application circuits using the SET elements described above.

According to a first aspect of the present invention, there is provided a single-electron tunneling element excited by a pump signal supplied from an alternating current power source, which comprises: at least one tunneling junction with a minute metal-insulator-metal sandwich structure or other tunneling junction small enough so that the Coulomb energy is significant compared with other energy in the system; and a biasing power source which is connected in series to at least one tunneling junction and whose ON/OFF operation is controlled by an external control input, wherein single-electron tunneling oscillations are generated in the at least one tunneling junction and the generated oscillations are phase-locked to subharmonics of the pump signal to thus exhibit a plurality of stable phase states.

According to a second aspect of the present invention, there is provided a logic network, constituted so as to realize a predetermined logic operation in a computer, which comprises: a plurality of gates operatively connected to each other so as to carry out the predetermined logic operation, and each including a single-electron tunneling element; and an alternating current power source which supplies a pump signal for exciting each single-electron tunneling element in the plurality of gates, wherein: each single-electron tunneling element in the plurality of gates includes at least one tunneling junction and a biasing power source which is connected in series to at least one tunneling junction and whose ON/OFF operation is controlled by a corresponding external control input, wherein single-electron oscillations are generated in the at least one tunneling junction and the generated oscillations are phase-locked to subharmonics of the pump signal to thus exhibit a plurality of stable phase states, and wherein an input signal with a frequency half that of the pump signal is continually applied to a specified gate among the plurality of gates, while the biasing power sources of all of the gates are kept in the ON state.

According to a third aspect of the present invention, there is provided a logic network, constituted so as to realize a predetermined logic operation in a computer, which comprises: a plurality of gates operatively connected to each other so as to carry out the predetermined logic operation, and each including a single-electron tunneling element; and an alternating current power source which supplies a pump signal for exciting each single-electron tunneling element in the plurality of gates, wherein each single-electron tunneling element in the plurality of gates includes at least one tunneling junction and a biasing power source which is connected in series to the at least one tunneling junction and whose ON/OFF operation is controlled by a corresponding external control input, wherein single-electron tunneling oscillations are generated in the at least one tunneling junction and the generated oscillations are phase-locked to subharmonics of the pump signal to thus exhibit a plurality of stable phase states, and wherein when the biasing power source of a specified gate among the plurality of gates is switched ON, the biasing power sources of all of a first group of gates providing inputs to the specified gate, and the biasing power sources of all of a second group of gates providing inputs to the first group of gates, are kept in the ON state.

BRIEF DESCRIPTION OF THE DRAWINGS

Other objects and features of the present invention will be described hereinafter, in detail, by way of preferred embodiments with reference to the accompanying drawings, in which:

FIGS. 16a and 16b are explanatory views of two phase states based on subharmonic phase locking at the gate shown in FIG. 14a;

DESCRIPTION OF THE PREFERRED EMBODIMENTS

The present invention is based on bistability in a SET element phase locked at a subharmonic of an external A.C. signal. We have simulated the detailed operation of such a phase-locked SET element and find useful operating characteristics for logic circuitry, as described later.

We note that the subharmonic phase locking mechanism in this invention is different from the conventional power transfer mechanism through the NRS elements, described above. With regard to parametric computers, this is clearly evident from the fact that the bistable SET element does not involve filters at harmonic frequencies and the fact that the SET junction can oscillate at f0 even without a pump signal (that is, without any power transfer whatsoever). Instead, in our invention, harmonics of internal SET oscillations driven by the DC power source interact nonlinearly with the pump and synchronize.

Figure 1:
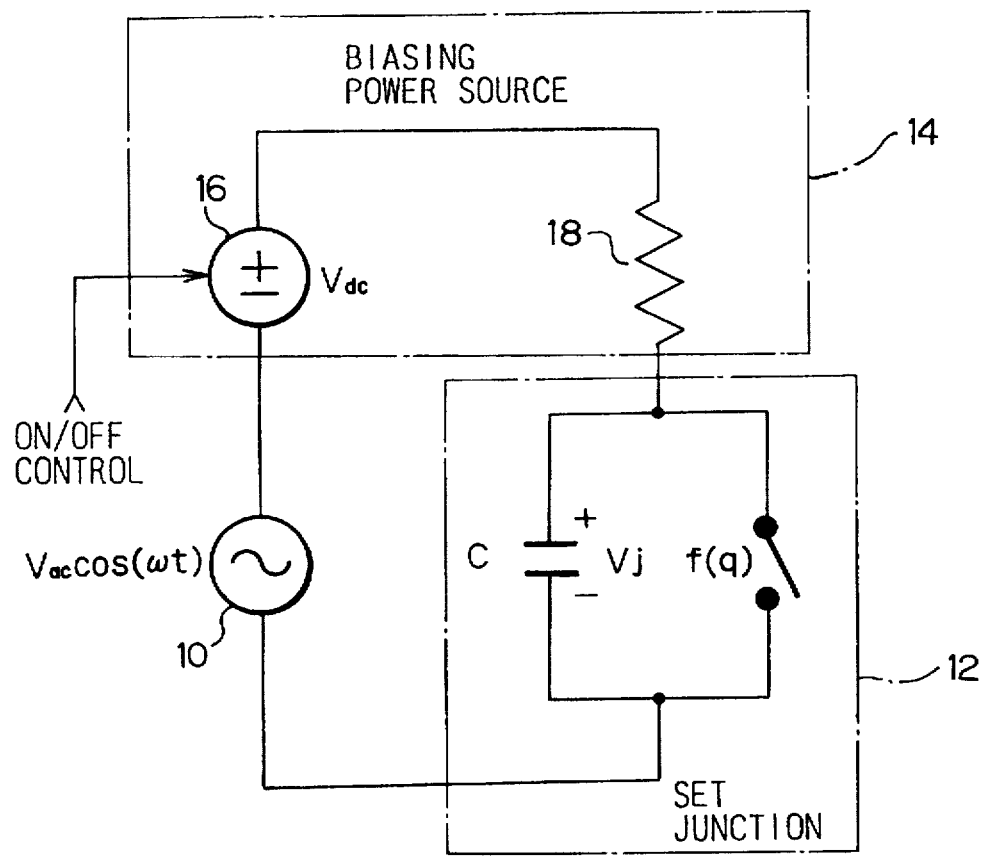
FIG. 1 is an equivalent circuit diagram showing the basic constitution of an SET element according to the present invention.

Therefore, as shown in FIG. 1, according to the present invention, there is provided a single-electron tunneling (SET) element excited by a pump signal supplied from an alternating current power source 10, including: at least one tunneling junction (SET junction) 12 with a minute metal-insulator-metal sandwich structure; and a biasing D.C. power source 14 which is connected in series to at least one tunneling junction and whose ON/OFF operation is controlled by an external control input, wherein SET oscillations are generated in the at least one tunneling junction and the generated oscillations are phase-locked to subharmonics of the pump signal to thus exhibit a plurality of stable phase states.

Hereinafter, the function of the SET element according to the present invention will be described with reference to FIGS. 2a to 4b.

Figure 2A:
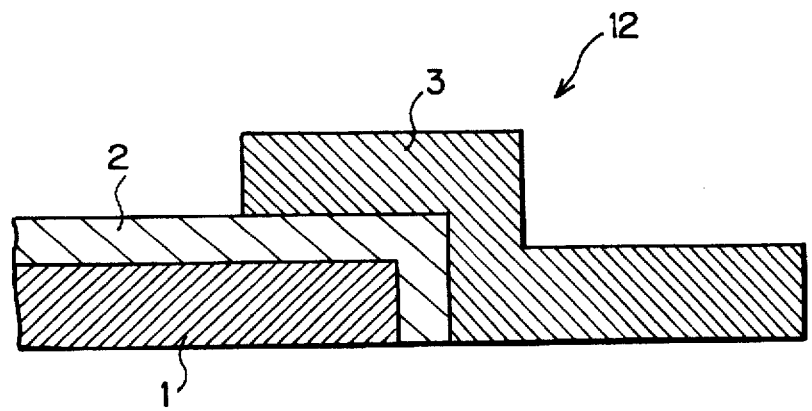
FIGS. 2a and 2b are explanatory views each useful for explaining the SET junction shown in FIG. 1.
Figure 2B:
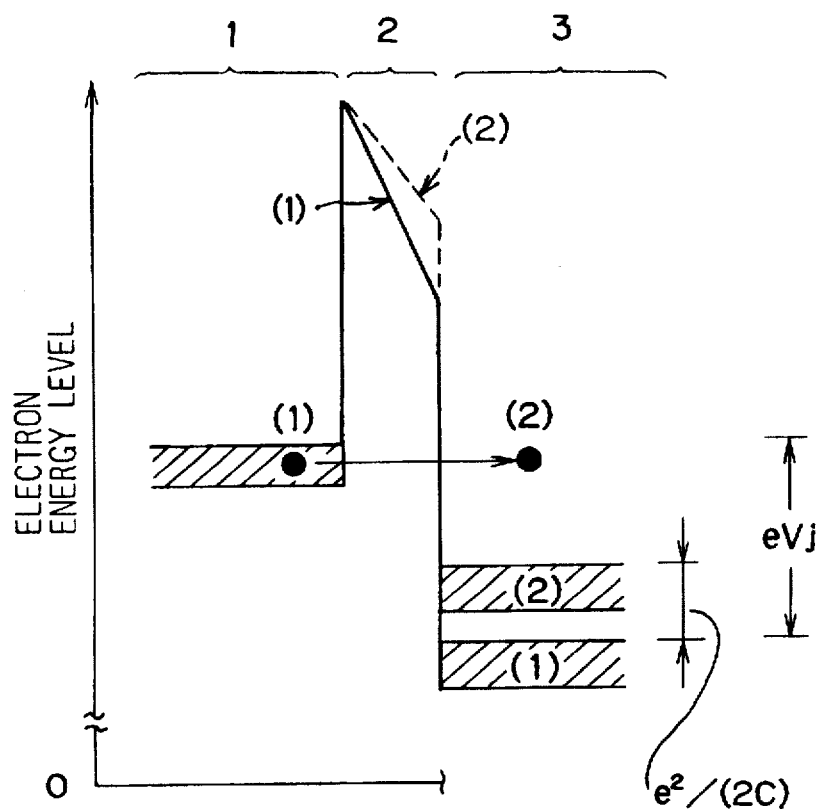

The SET junctions are ultra-small tunneling structures which have very small capacitance C such that the change in columbic energy $e^2/(2C)$ for a single electron tunneling event is large in comparison with the thermal energy kT and comparable to the junction bias voltage eV. This is illustrated in FIGS. 2a and 2b for the case of a small metal-insulator-metal (MIM) junction or a metal-oxide-metal (MOM) junction. However, many other physical structures are of course possible and produce the same effect without being limited to the examples shown in the drawings. FIG. 2a shows the section of a very small MIM (or MOM) sandwich structure in which the SET junction is formed. In the drawing, reference numerals 1 and 3 denote a metal film and reference numeral 2 denotes an insulating film (or an oxide film). FIG. 2b shows the model of a conduction band representing the behaviour of single-electron tunneling in this sandwich structure.

Figure 3A:
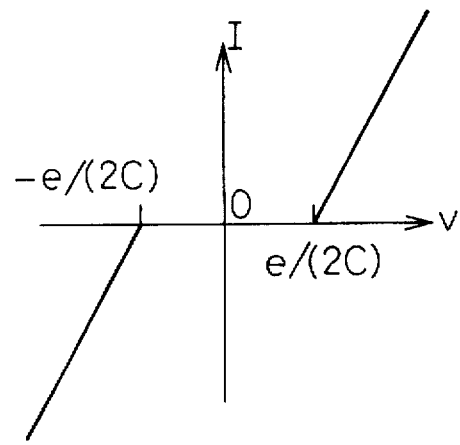
FIGS. 3a to 3c are explanatory views each useful for explaining the phenomenon occurring at the SET junction shown in FIG. 1.
Figure 3B:
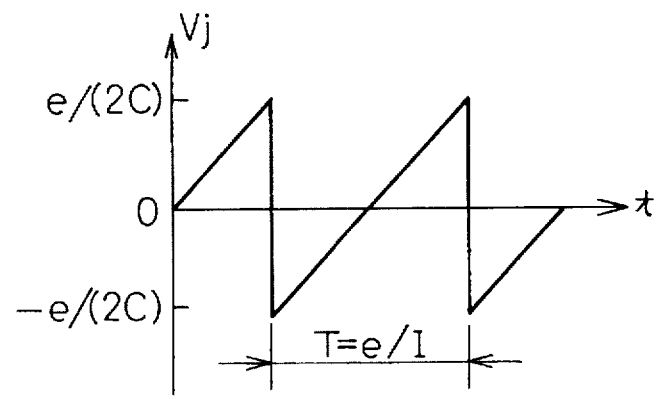
Figure 3C:
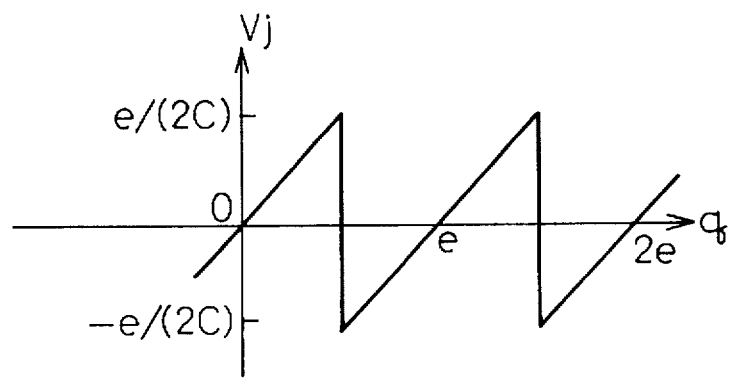

As shown in FIG. 3a, the change in the columbic energy $e^2/(2C)$ described above so functions as to block single-electron tunneling in the low impressed voltage state (the portion $-e/(2C)<V<e/(2C)$ in the drawing). As a result, a coherent voltage oscillation (see FIG. 3b) is induced under a certain condition. For example, the voltage signal oscillates in a cycle of T=e/I for a predetermined current bias. By the way, FIG. 3c shows the change in the SET junction voltage $eV_j$ for the integrated total current in the SET junction.

Figure 4A:
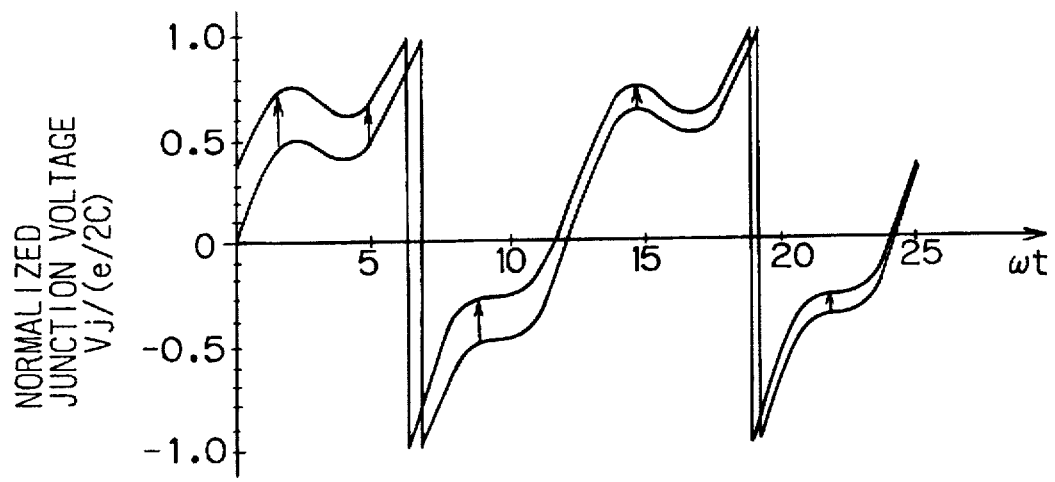
FIGS. 4a and 4b are diagrams each showing a typical simulation result of bistable phase locking of the SET junction according to the equivalent circuit model shown in FIG. 1.
Figure 4B:
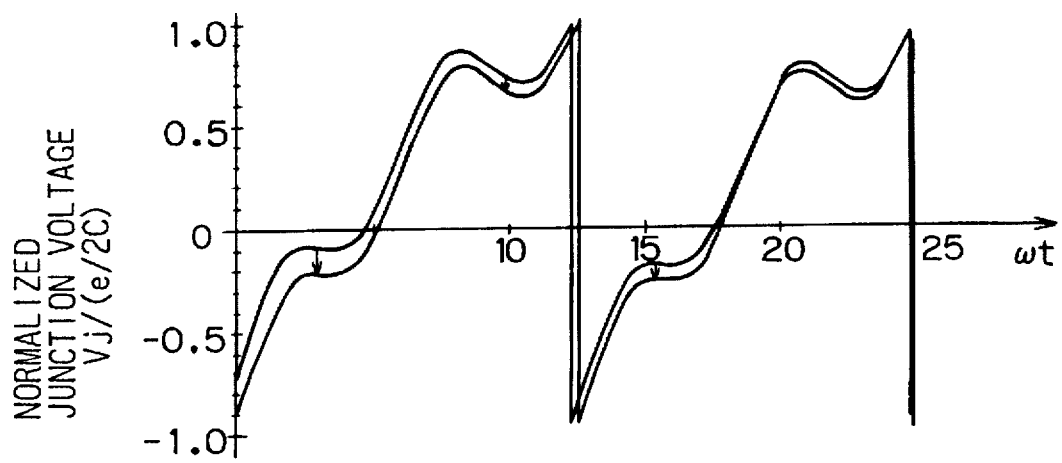

In the present invention, bistable phase-locking at a subharmonic of the pump signal is obtained. This bistable locking is illustrated in FIGS. 4a and 4b. The results are for a SET junction as modelled by the equivalent circuit shown in FIG. 1. This SET junction is connected through a series resistance 18 to a D.C. voltage source 16 and to an A.C. pump signal source 10 as shown in FIG. 1. In this case, the following equation can be established.

$$Vdc+Vac\ cos(\omega t)=R\ dq/dt+(e/2C)f(q)$$

where $V_j=(e/2C)f(q)$, and f(q) is a linearly periodic function with the period e, which is given by the following formulas.

$$f(q)=2q/e\ \text{(when}\ 0<q<e/2)$$

$$f(q)=2q/e-2\ \text{(when}\ e/2<q<e)$$

Incidentally, the simulation results shown in FIGS. 4a and 4b are obtained on the basis of the following device values:

$$C=1\times10^{-18}\ [F],\ e/2C=0.080\ [V],\ \omega/2\pi=100\ [GHz],$$

$$R=15\ [M\Omega],\ Vdc=0.136\ [V],\ Vac=0.160\ [V]$$

FIGS. 4a and 4b show the relationship of a normalized junction voltage $V_j/(e/2C)$ with ωt (angular frequency time of the pump signal), that is, the time evolution of the SET junction voltage $V_j$ for two different values of the initial junction charge q. Each segment of the waveform corresponds to four cycles of the pump signal. This simulation result demonstrates that subharmonic locking to the pump signal occurs within two to three cycles. The waveforms shown in FIGS. 4a and 4b demonstrate that the phases differ by π [rad], that is, phase locking has two stable states.

Although the example shown in FIGS. 4a and 4b represents the mode of bistable phase locking, it would be obvious to those skilled in the art from the results shown in these drawings that n stable states can be obtained by phase-locking the resulting single electron tunneling oscillation at the nth subharmonic of the pump signal.

Next, concrete embodiments using the SET element according to the present invention will be explained.

Figure 5:
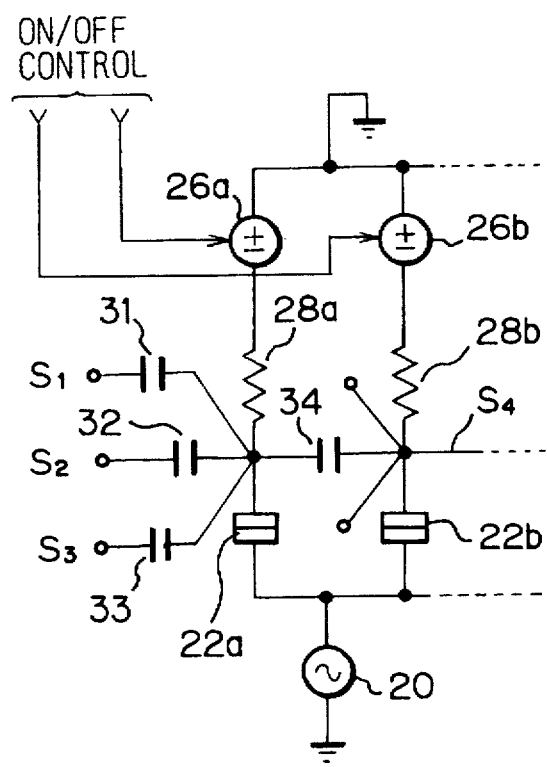
FIG. 5 is a circuit diagram showing the constitution of a logic circuit using the SET element according to the first embodiment of the present invention.

FIG. 5 shows the constitution of a logic circuit using the SET element according to the first embodiment of the present invention.

The circuit in this embodiment schematically represents the constitution of two-stage three-input logic gate. In the drawings, reference numeral 20 denotes a signal source (angular frequency $2\omega_0$) for continuously supplying the pump signal, reference numerals 22a and 22b denote the SET junctions, reference numerals 26a and 26b denote biasing D.C. voltage sources adjusted by a control input, and reference numerals 28a and 28b denote resistances connected in series to the corresponding SET junctions, respectively. Symbols $S_1$ to $S_3$ denote AC input signals (angular frequency $\omega_0$), which are capacitively coupled through reactance elements (capacitors 31 to 33 in this embodiment) to the SET element (SET junction 22a, D.C. voltage source 26a, resistor 28a) of the initial stage. Symbol $S_4$ denotes the output signal going to the SET element (SET junction 22b, D.C. voltage source 26b, resistor 28b) of the next stage. The oscillation output terminal of each SET element is capacitively coupled with that of other through a capacitor 34.

In this constitution, the input signal of the logic circuit is the sum of three input signals $S_1$ to $S_3$, and this sum determines the phase state of the initial gate (that is, the SET element) when the D.C. voltage source 26a is turned ON. This phase state is transferred to the gate of the next stage (that is, the SET element) when the D.C. voltage source 26b of the next stage is turned ON. In the other words, the flow of the logic can be controlled by sequentially turning ON the D.C. voltage sources 26a, 26b of the SET elements on the basis of the control input.

Figure 6:
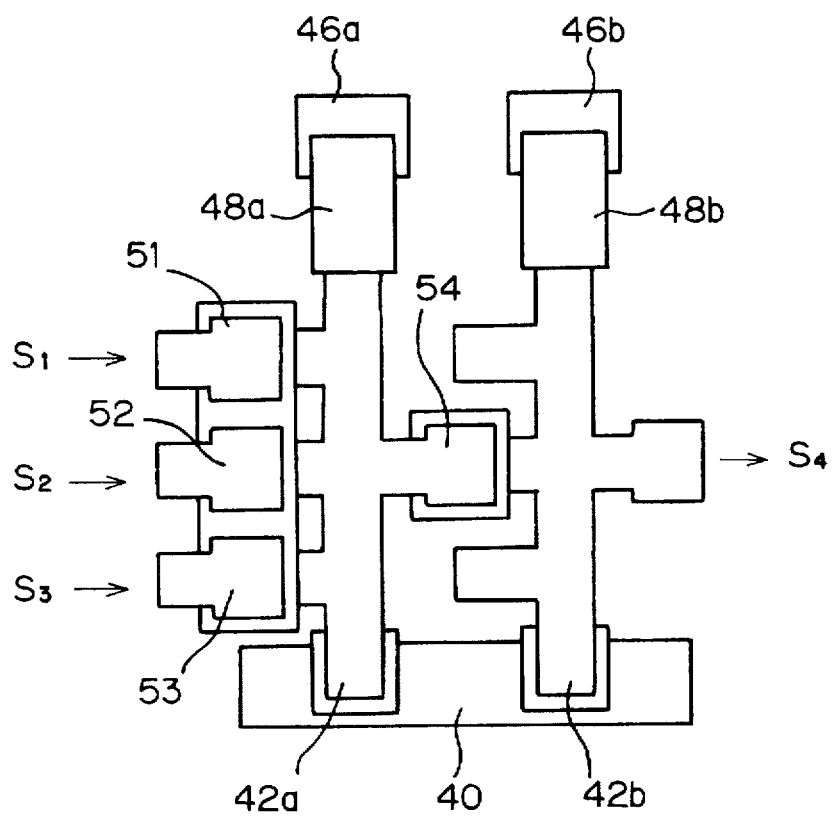
FIG. 6 is a view showing the layout pattern of each device in the circuit shown in FIG. 5.

FIG. 6 shows a layout pattern of each element in the circuit shown in FIG. 5.

In this drawing, reference numeral 40 denotes a signal line for supplying the pump signal, and reference numerals 46a and 46b denote signal lines for supplying bias voltages of the D.C. voltage sources 26a and 26b, respectively. Reference numerals 42a and 42b correspond to the SET junctions 22a and 22b and reference numerals 51 to 54 correspond to the coupling capacitors 31 to 34, respectively. Incidentally, each SET junction 42a, 42b and each capacitor 50 to 54 are formed on the basis of the MIM junction shown in FIG. 2a, respectively.

Figure 7:
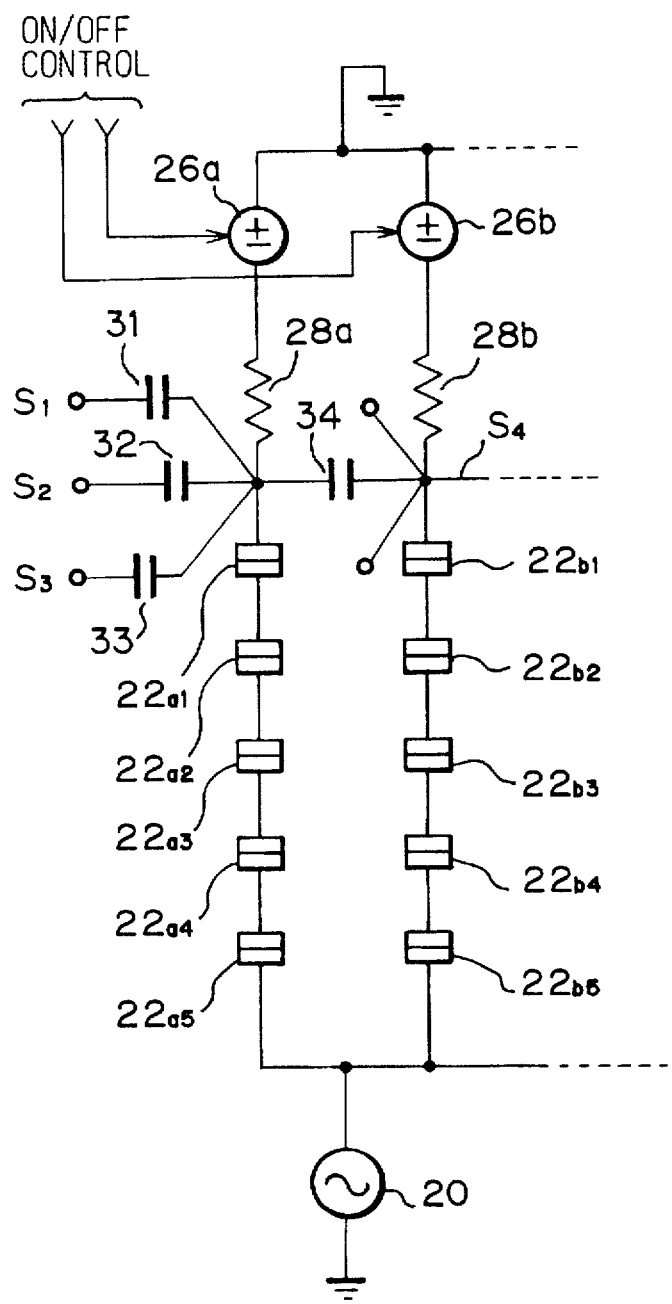
FIG. 7 is a circuit diagram showing the constitution of a logic circuit using the SET element according to the second embodiment of the present invention.
Figure 8A:
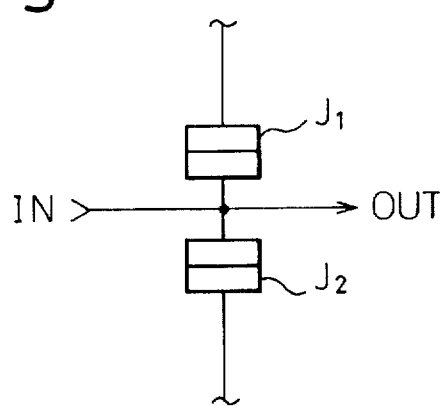
FIGS. 8a to 8d are diagrams showing parts of various modifications of each logic circuit shown in FIGS. 5 and 7.
Figure 8B:
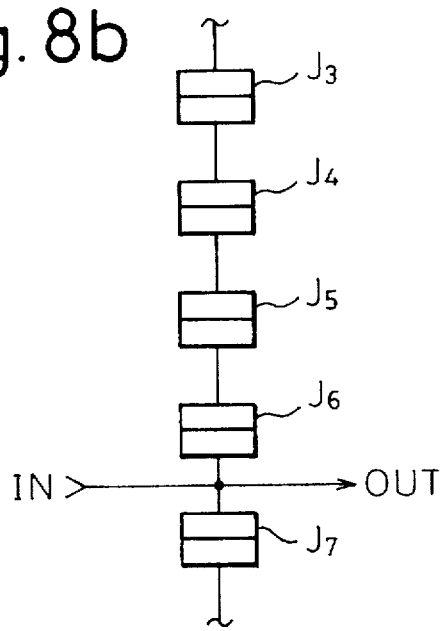
Figure 8C:
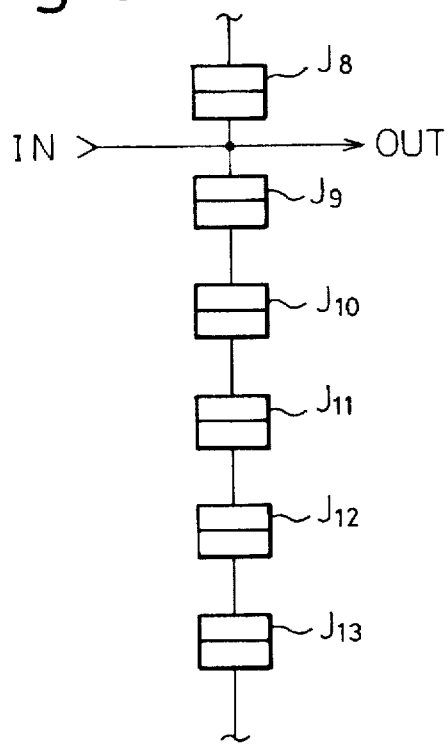
Figure 8D:
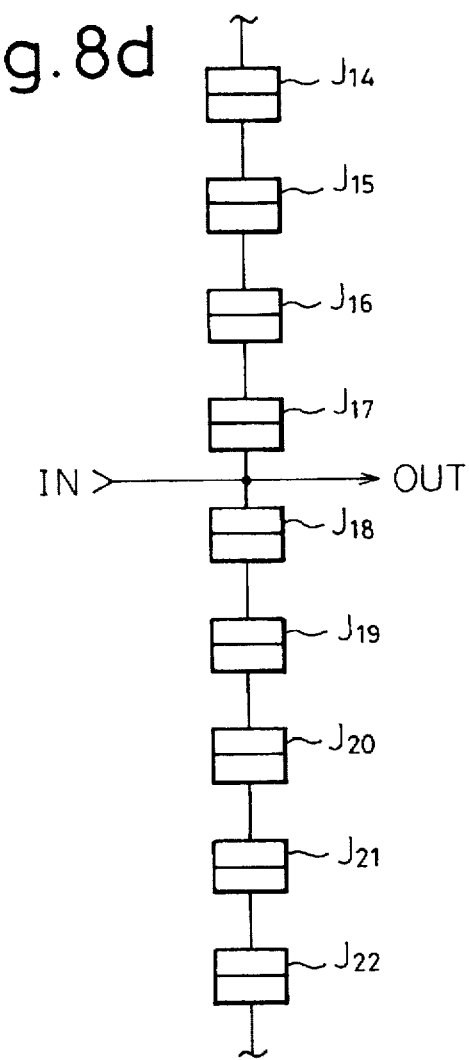

FIG. 7 shows the constitution of a logic circuit using the SET element according to the second embodiment of the present invention.

The characterizing feature of this embodiment resides in that a plurality of SET junctions 22a1 to 22a5, 22b1 to 22b5 connected in series with one another, respectively, are disposed in place of single SET junction 22a, 22b of each gate stage (that is, the SET element) in the embodiment shown in FIG. 5. Since the rest of the constitution remain the same, the explanation will be omitted.

When the SET element is constituted by using a plurality of SET junction as described above, the required value of the series resistance in the circuit can be equivalently reduced and miniaturization can be attained. Another advantage is that the influences of the parasitic capacitance can be reduced.

FIGS. 8a to 8d show parts of various modifications of each logic circuit shown in FIGS. 5 and 7. In FIGS. 8a to 8d, references $J_1$ to $J_{22}$ denote SET elements.

Figure 9:
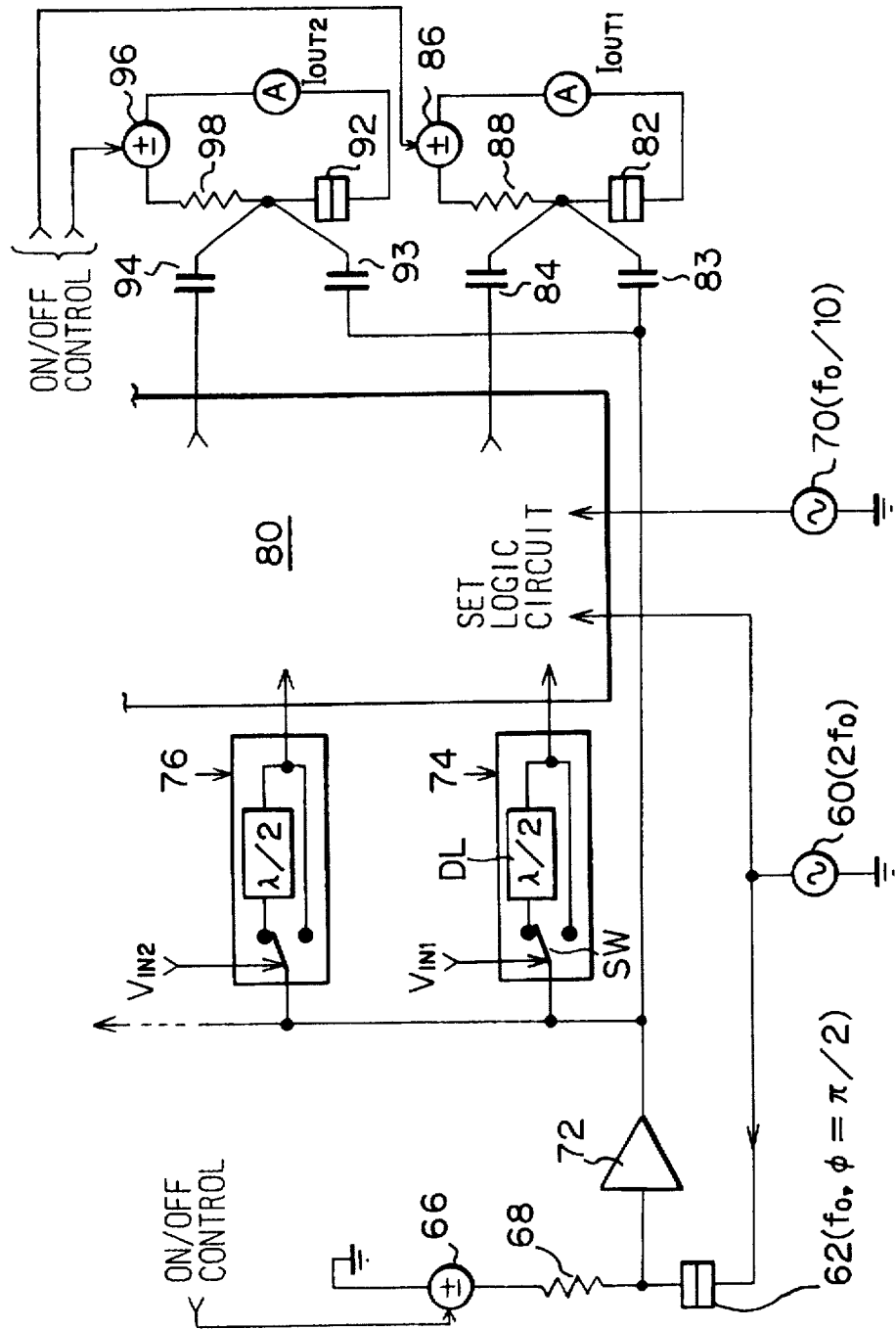
FIG. 9 is a circuit diagram showing the constitution of an input/output circuit using the SET element according to the third embodiment of the present invention.

FIG. 9 shows the constitution of an input/output circuit using the SET element according to the third embodiment of the present invention. The circuit shown in the drawing is directed to effect conversion between an external D.C. logic signal and an A.C. signal (phase state) of an internal SET logic circuit.

In the drawing, reference numeral 60 denotes a signal source (frequency 2fo) for continuously supplying the pump signal, reference numerals 62, 82 and 92 denote the SET junctions, reference numerals 66, 86 and 96 denote bias D.C. voltage sources regulated by the control input, and reference numerals 68, 88 and 98 denote resistors connected in series to the corresponding SET junctions, respectively. The SET junction 62, the D.C. voltage source 66 and the resistor 68 constitute the SET element used as the phase reference of the system in cooperation with the pump signal source 60. Reference numeral 70 denotes a signal source (frequency fo/10) for generating a clock, reference numeral 72 denotes an amplifier for amplifying the output of the reference SET element, and reference numerals 74 and 76 denote phase shifters corresponding to the output signals of the amplifier 72, respectively. Each phase shifter 74, 76 includes a switching element SW turned ON and OFF on the basis of an external D.C. logic signal $V_{IN1}$, $V_{IN2}$ and a delay element (e.g. λ/2 delay line) DL connected to the output of the amplifier 72 through the switching element SW, whenever necessary. The switching element could be a microwave transistor, for example. For an input signal frequency of 100 GHz, for example, a GaAs microstrip delay line with a length of 400 [μm] can be employed as the delay device DL.

Reference numeral 80 denotes a SET logic circuit for processing the output signal of the reference SET element in response to the pump signal and to the clock signal, and reference numerals 83, 84, 93 and 94 denote coupling reactance elements (capacitors in this embodiment) for the SET junctions 82, 92 of the output stage. Incidentally, as will be described later, the SET junctions 82 and 92 of the output stage function as detectors for detecting the phase of the A.C. output signal by comparing it with the output signal of the reference SET element.

In this embodiment, the SET elements (60, 62, 66, 68) are phase-locked to the subharmonic of the pump signal and are used as the phase reference of the system. In other words, the phase of this SET element is defined as one phase state (for example, as $\Phi=\pi/2$ for a binary system having two states $\pi/2$ and $-\pi/2$). This signal is amplified by the amplifier 72 and is then distributed to the phase shifters 74 and 76. Next, connection of the delay element DL to the phase shifters 74 and 76 is switched on the basis of the control signals $V_{IN1}$ and $V_{IN2}$, thereby providing the phase $\pi/2$ or $-\pi/2$ to the A.C. input signal of the SET logic circuit 80. The A.C. output signal from the SET logic circuit 80 is converted to the D.C. signal by utilizing the SET junctions 82, 92 of the output stage as the A.C. detector. The SET detector described above is based on the change in the D.C. junction characteristics when the injected A.C. signal exists.

Figure 10:
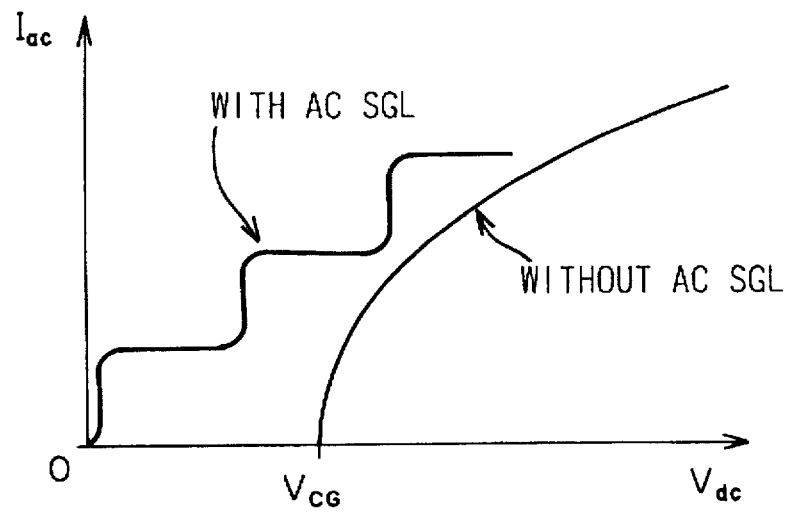
FIG. 10 is a characteristic diagram showing the relationship between a D.C. voltage and an A.C. current at the SET junction when an external A.C. signal exists and when the external A.C. signal does not exist.

When the A.C. signal does not exist as shown in FIG. 10, for example, the SET junction provides an output current of zero (0) at D.C. bias voltages Vdc below the coulomb gap $V_{CG}$. When the A.C. signal is present, however, the characteristics assume different forms due to the phase locking described above, so that the D.C. level shifts step-wise.

Referring again to FIG. 9, the phase of the output signal of the SET logic circuit 80 can be detected by summing with the signal from the reference element (having an equal amplitude) through the coupling capacitors 83, 84, 93, 94. In accordance with the characteristic diagram of FIG. 10, the output signal having the same phase as that of the reference signal and the output signal having the different phase will give a high D.C. current level and a low D.C. current level, respectively.

As a specific example of the design values for this parametric computer, the inventors of the present invention consider the operation at a clock frequency $f_{clock}$ (clock signal source 70) equal to 10 GHz. In order to provide a sufficient SET element cycle for acquiring phase locking in each clock cycle, the present inventors design the SET element frequency fo to $10 f_{clock}$. Further, in order to insure that the signal level is well above the noise level, the present inventors design the SET junction capacitance C so that the amplitude V=e/C of SET oscillation is equal to 10 kT. From the following relations for the per-gate D.C. current I, switching energy E and power consumption P, E=Pτ=eV/2

P=eVfo/2

I=efo the present inventors obtain the following design values.

| T [k] | Pτ [J] | P [W] | C [F] |
|---|---|---|---|
| 4.2 | $3 \times 10^{-22}$ | $2.8 \times 10^{-11}$ | $4.6 \times 10^{-17}$ |
| 77 | $5 \times 10^{-21}$ | $5.0 \times 10^{-10}$ | $2.5 \times 10^{-18}$ |
| 300 | $2 \times 10^{-20}$ | $2.0 \times 10^{-9}$ | $6.4 \times 10^{-19}$ |

This table shows that the computer using the proposed SET element as the basic constituent element operates with an extremely low power-delay product. Accordingly, a ultra-high speed operation can be accomplished by a high density circuit.

As already described, transfer of the phase information between each gate in the computer using the SET elements as the logic gates is controlled by applying the voltage of the bias voltage source to each gate by the three-phase clocking system. When this transfer of the phase information between the gates is controlled by such a three-phase clocking system, however, a disadvantage occurs in that the phase information held by the gate of a preceding stage inverses during the period in which the phase information is inputted from the gate of the preceding stage, depending on the circuit system of each gate or the parameters of the circuit elements used or the application timing of the power source clock.

Figure 11:
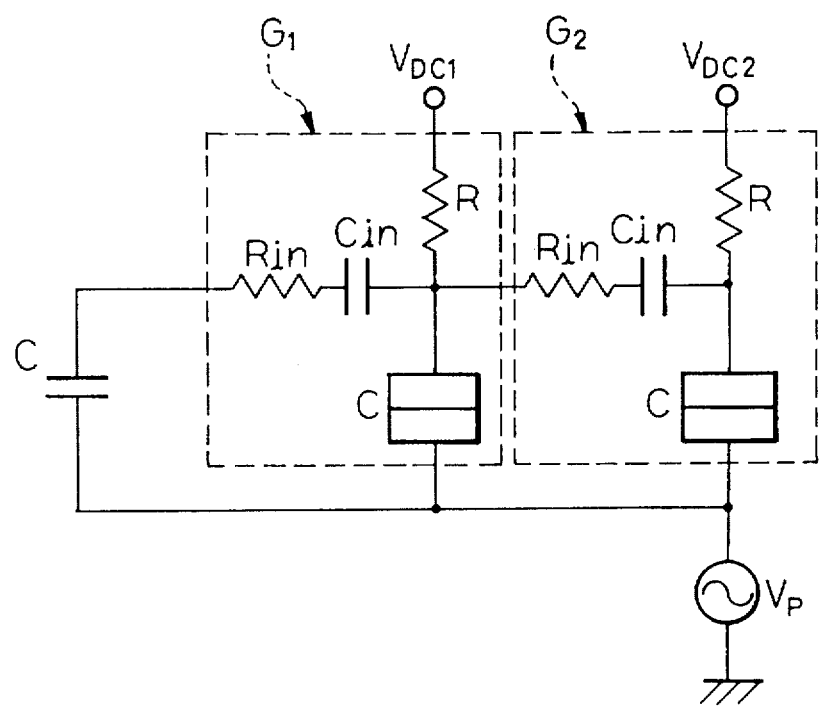
FIG. 11 is a circuit diagram showing a model circuit used for simulation in order to examine the phase inversion phenomenon at a gate of a pre-stage.

Therefore, the present inventors have carried out simulation using a model circuit shown in FIG. 11 so as to examine the phase inversion at the gate of the preceding stage. The simulation results are shown in FIGS. 12a to 13b.

Referring initially to FIG. 11, symbols $G_1$ and $G_2$ denote the gates constituting the logic network in a computer, symbol C denotes a SET junction (capacitance), symbol R denotes a resistor (resistance) connected in series with the SET junction, symbol $C_{in}$ denotes a coupling capacitor (capacitance) for inputting a signal having the phase information, symbol $R_{in}$ similarly denotes a resistor (resistance) for input coupling, symbols $V_{DC1}$ and $V_{DC2}$ denote power sources (power source clocks) for the gates $G_1$ and $G_2$, respectively, and symbol $V_p$ denotes an A.C. power source (pump signal) for exciting the element of each gate.

The simulation results shown in FIGS. 12a to 12d represent an example where the phase information is correctly transferred from the first stage gate $G_1$ (corresponding to the gate of the preceding stage) to the second stage gate $G_2$.

Figure 12A:
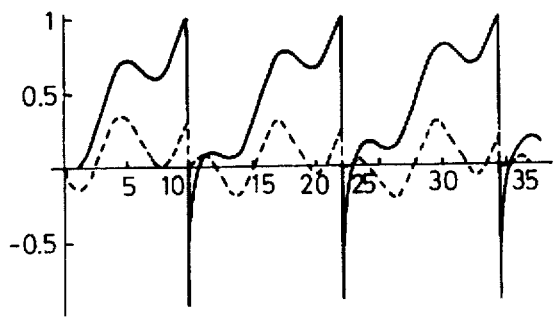
FIGS. 12a to 12d are diagrams each showing an example of a simulation result on the basis of the model circuit shown in FIG. 11.
Figure 12B:
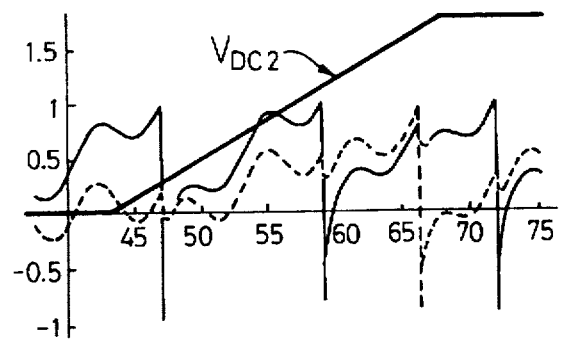
Figure 12C:
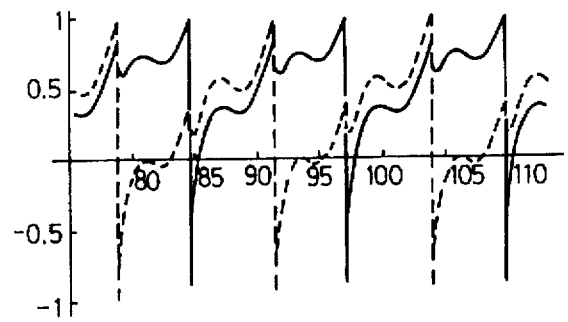
Figure 12D:
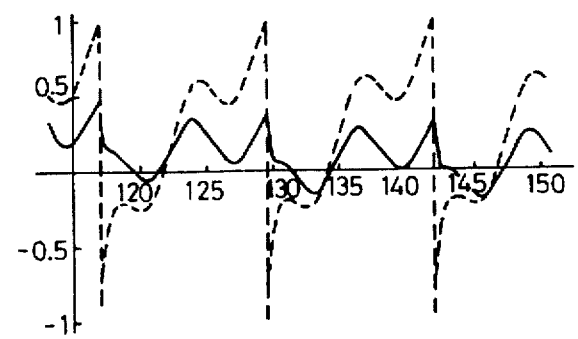

In other words, FIG. 12a shows the mode of oscillation at the gate $G_1$ (the waveform represented by a solid line) when the power source $V_{DC1}$ of the gate $G_1$ is ON, FIG. 12b shows the mode of oscillation at each gate $G_1$, $G_2$ when the power source $V_{DC2}$ of the gate $G_2$ is turned ON at a certain timing, FIG. 12c shows the mode of oscillation at each gate $G_1$, $G_2$ when the power source $V_{DC2}$ of the gate $G_2$ is turned ON and when reception of the phase information from the gate $G_1$ of the preceding stage is substantially completed, and FIG. 12d shows the mode of oscillation (waveform represented by broken line) at the gate $G_2$ when the power source $V_{DC1}$ of the gate $G_1$ is turned OFF.

As shown in the waveform diagrams of FIGS. 12b and 12c, the phase information to be held by the gate $G_1$ of the preceding stage is stable during the period in which the phase information is delivered from the gate $G_1$ of the preceding stage to the gate $G_2$. In other words, while the gate $G_1$ is in the phase state "1" (or "0"), the gate $G_2$ is in the phase state "0" (or "1"), and oscillation occurs in a predetermined cycle at each gate.

Figure 13A:
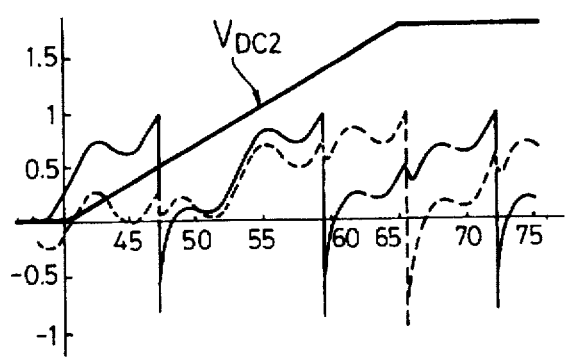
FIGS. 13a and 13b are diagrams each showing another example of a simulation result based on the model circuit shown in FIG. 11.
Figure 13B:
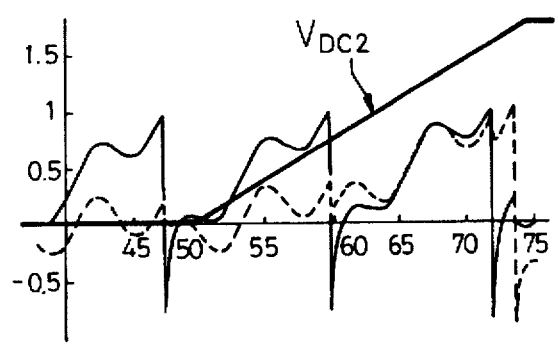

On the other hand, the simulation results shown in FIGS. 13a and 13b demonstrate an example where the phase information is not correctly transferred from the gate $G_1$ to the gate $G_2$.

The waveform diagram shown in FIG. 13a corresponds to the waveform diagram shown in FIG. 12b, though the application timing of the power source $V_{DC2}$ is different. In this case, the phase information can be correctly transferred from the gate $G_1$ to the gate $G_2$. In contrast, the waveform diagram shown in FIG. 13b is different from the waveform diagram shown in FIG. 13a in the application timing of the power source $V_{DC2}$. For this reason, a disadvantage occurs in that when the power source $V_{DC2}$ is completely turned ON, the oscillation signal of the gate $G_1$ (represented by the solid line) and the oscillation signal of the gate $G_2$ (represented by the broken line) exhibit the same phase state. In other words, this means that oscillation is unstable at the gate of the preceding stage and phase inversion takes place.

If the phase information to be held by the gate of the preceding stage is inverted when the phase information is transferred between the gates constituting the logic network as described above, the flow of the signals cannot be correctly controlled in the network. This is undesirable because it results in the erroneous operation of the computer, as a whole, constituted by various logic networks.

It is believed that the reason why the phase information inverses at the gate of the preceding stage in the prior art technology described above is because the stability of the state for holding the phase information (that is, SET oscillation) is low. It is therefore believed effective to stabilize by any means the SET oscillation occurring at the gate of the preceding stage when the phase information is received at each gate from the gate of the preceding stage. Hereinafter, several means for stabilizing such SET oscillation will be explained.

Figure 14A:
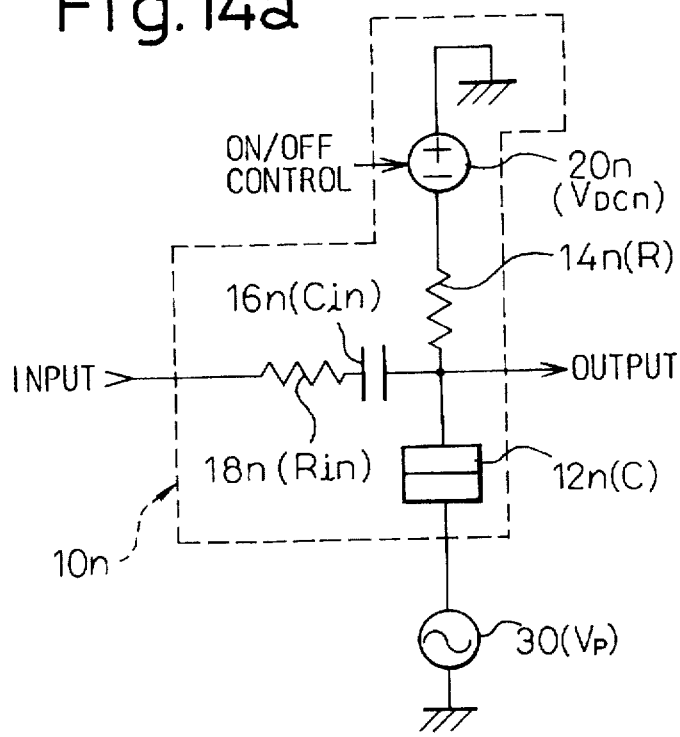
FIGS. 14a to 14c are diagrams each showing a logic network using the SET element according to the fourth embodiment of the present invention.
Figure 14B:
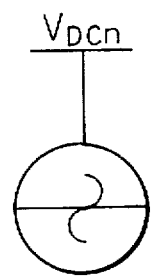
Figure 14C:
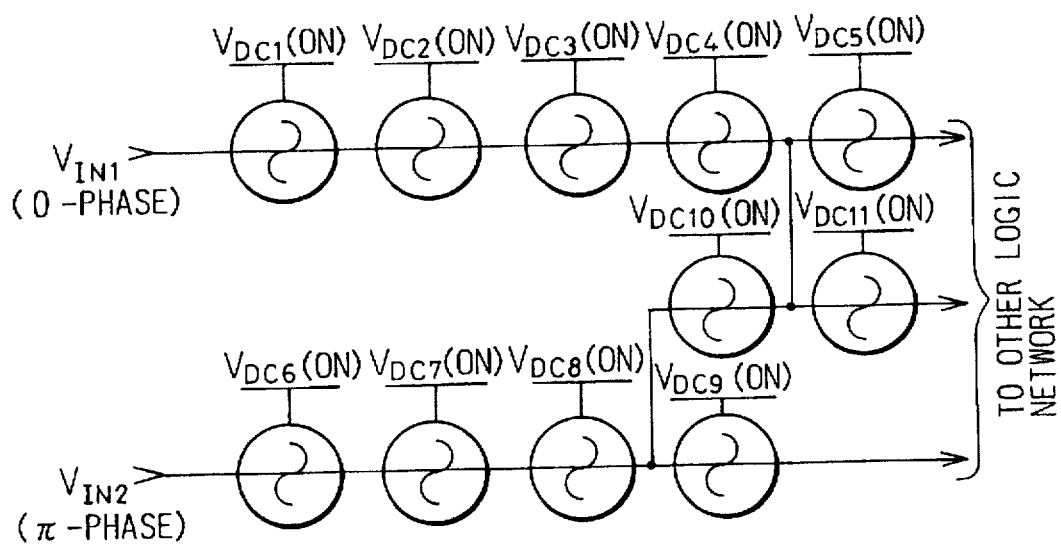

FIGS. 14a to 14c typically illustrate the constitution of the logic network using the SET element according to the fourth embodiment of the present invention.

FIG. 14a shows the constitution of each gate that constitutes the logic network, FIG. 14b shows its symbol representation, and FIG. 14c shows a structural example of the logic network.

In FIG. 14a, a portion $10_n$ encompassed by the broken line corresponds to the gate having the SET element. The SET element includes a SET junction $12_n$ (capacitance C), a resistor $14_n$ (resistance R) connected in series to the SET junction and a bias power source $20_n$ (D.C. voltage $V_{DCn}$) subjected to the ON/OFF control. The gate $10_n$ includes a capacitor $16_n$ (capacitance $C_{in}$) for input coupling and a resistor $18_n$ (capacitance $R_{in}$). Further, a pump signal source 30 (pump signal Vp) for exciting each SET element is connected to each gate $10_n$. Symbols $V_{IN1}$ and $V_{IN2}$ represent external input signals which have a predetermined frequency and whose phases are mutually different by $\pi$ [rad]. This external input signal may be a sinusoidal signal as represented by the later-appearing FIG. 15b or may be a sawtooth signal analogous to the oscillation signal generated at the SET junction.

The symbol display in FIG. 14b shows the pump signal source 30 which is connected on the 1:1 basis to each gate $10_n$, but this is for the purpose of simplification. In practice, the signal source 30 is shared by each gate $10_n$ and only the pump signal Vp is applied to each gate $10_n$.

In this embodiment, the resistor 14n is connected in series to the SET junction $12_n$ so as to enable SET oscillation, but another SET junction, or the like, may be used in place of such a resistor. This is advantageous from the aspects of the integration density and the process.

Figure 15A:
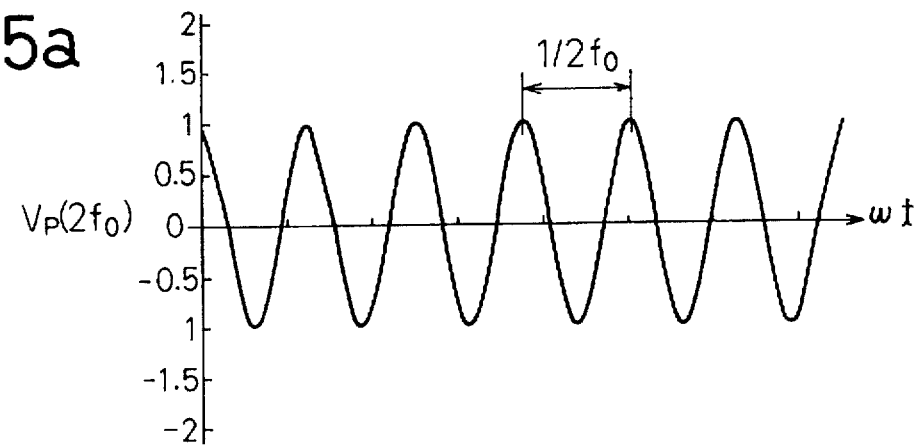
FIGS. 15a to 15c are waveform diagrams of each signal used in the fourth embodiment of the present invention.
Figure 15B:
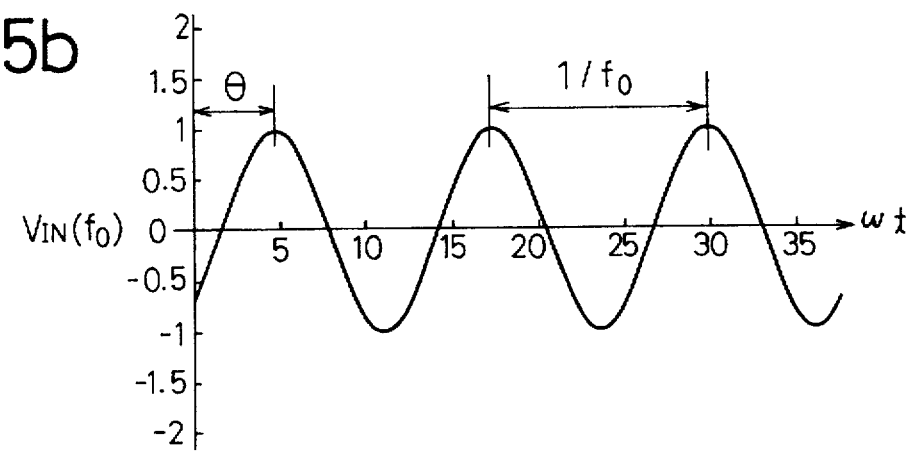
Figure 15C:
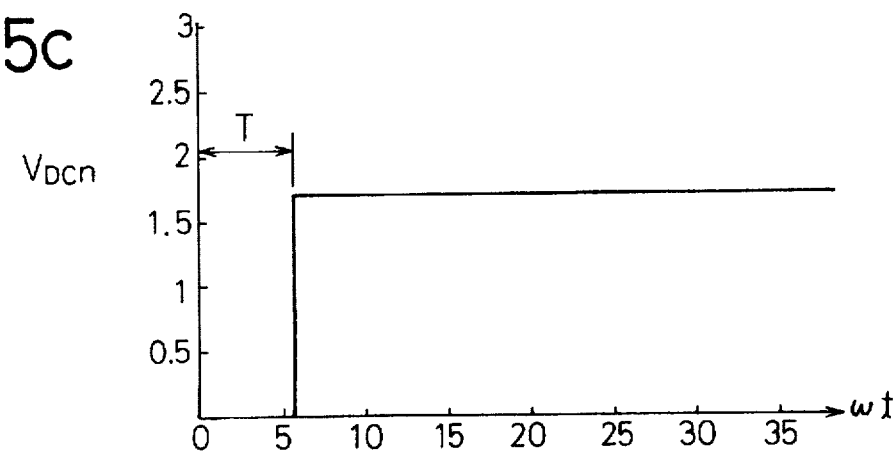

FIGS. 15a to 15c show the waveform of each signal used in the fourth embodiment of the present invention. FIG. 15a shows the waveform of the pump signal $V_p$ (frequency 2fo), FIG. 15b shows the waveform of the external input signal $V_{IN}$ (frequency fo) and FIG. 15c shows the waveform of the power source voltage of each gate, that is, power source clock $V_{DCn}$. Incidentally, the direction of the ordinate in each waveform diagram represents a normalized value.

Figure 16A:
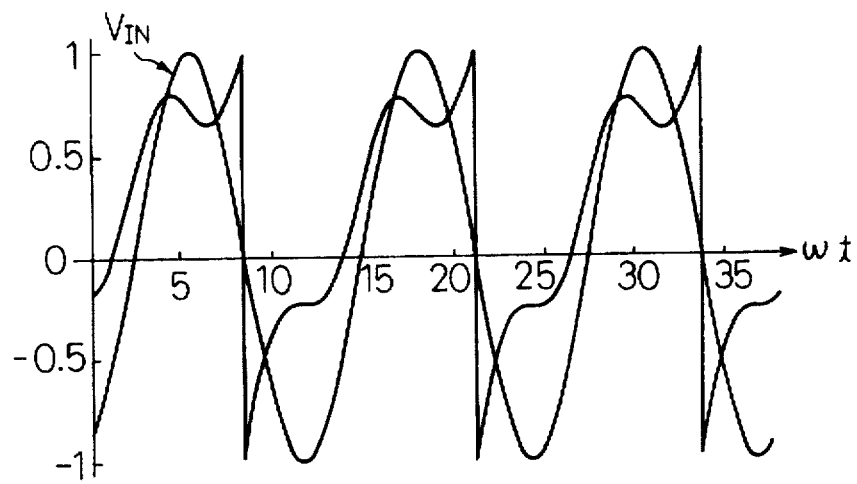
Figure 16B:
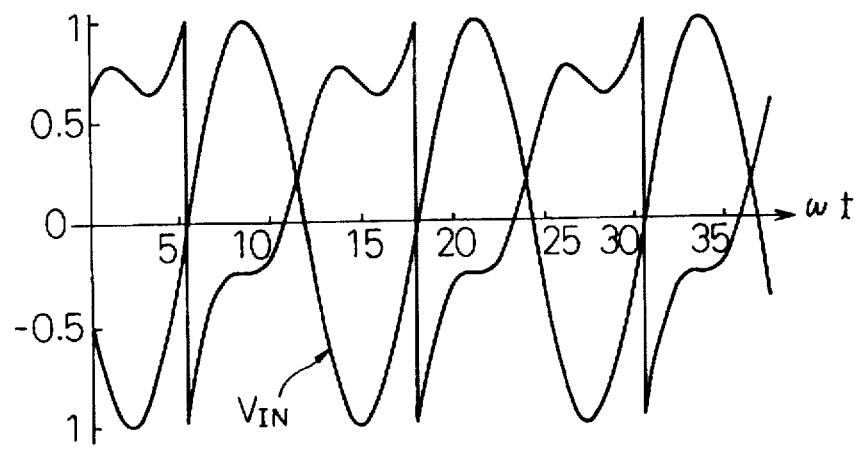

For reference, FIGS. 16a and 16b typically show two phase states on the basis of subharmonic phase locking at each gate.

According to this embodiment, the external input signal $V_{IN}$ ($V_{IN1}$ and $V_{IN2}$) having a frequency which is half of the frequency 2fo of the pump signal $V_p$ is continually applied to the specific gates (the gates $10_1$ and $10_6$ in the embodiment shown), and the power sources $V_{DC1}$ to $V_{DC11}$ of all the gates $10_1$ to $10_{11}$ are turned ON.

Accordingly, all the gates $10_1$ to $10_{11}$ that constitute the logic network are simultaneously and continually under the subharmonic phase locking state, and the network operates asynchronously as a whole between the gates. In this way, stable SET oscillation (that is, oscillation having phase information) can be attained at each gate, and the phase state of each gate is determined sequentially and primarily from the gates on the upstream side.

As a result, the phase inversion that has been observed at the gate of the conventional logic network can be eliminated and, eventually, a computer devoid of the erroneous operation can be constituted.

In this case, it is of course necessary to select optimum timings for the application timing of the external input signal $V_{IN}$ and the ON timing of the power source of each gate, in accordance with the intended functions of the logic network.

To correctly control the phase state of each gate during the transfer process of the phase information between the gates, it has been clarified that the capacitance of the SET junction $12_n$ used for each gate and the amplitude value of the external input signal $V_{IN}$ must be set to the optimum values, respectively.

Figure 17:
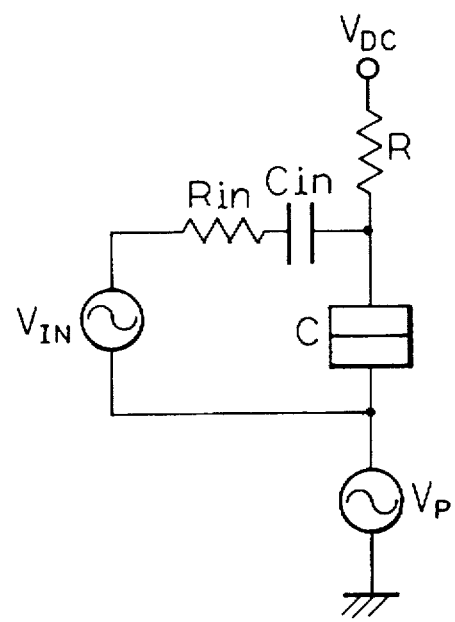
FIG. 17 is a circuit diagram showing a model circuit used for a simulation in order to decide the optimum SET junction capacitance.
Figure 18A:
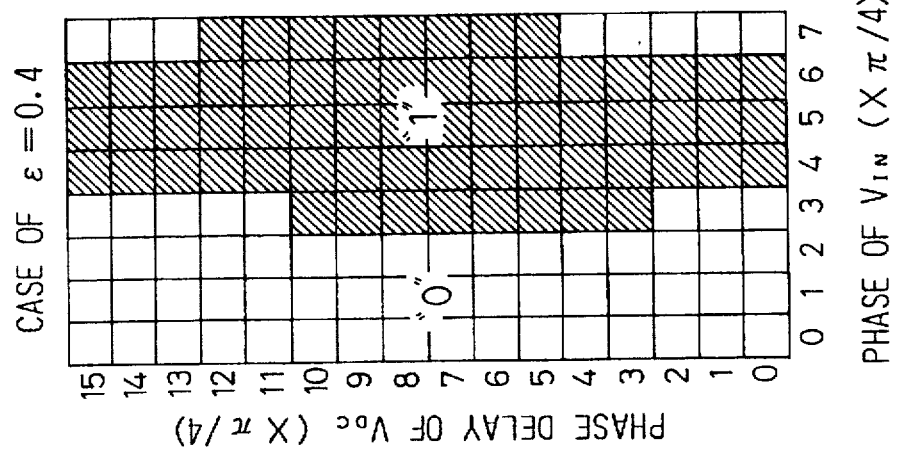
FIGS. 18a and 18b are diagrams showing the simulation results based on the model circuit shown in FIG. 17.
Figure 18B:
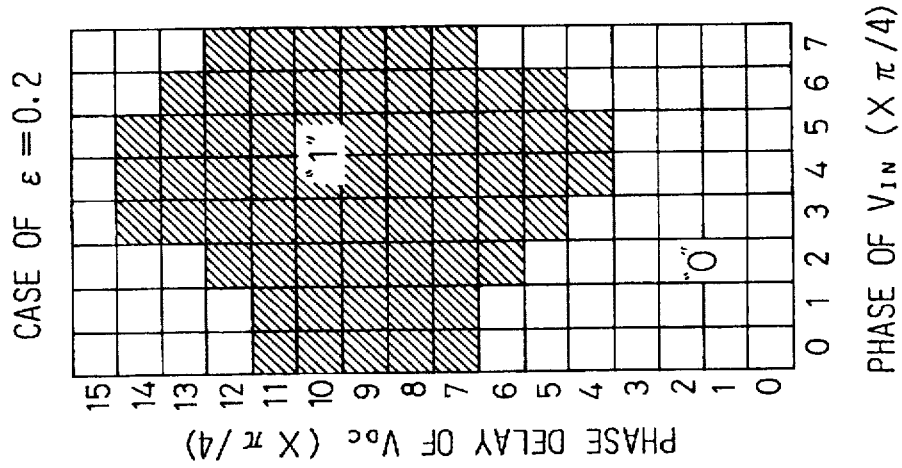
Figure 19:
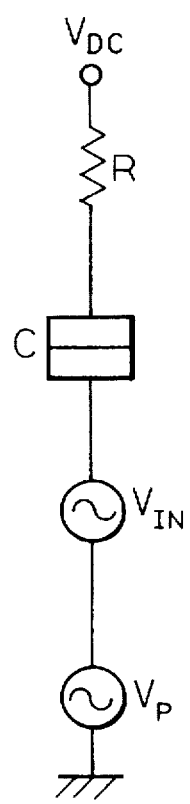
FIG. 19 is a circuit diagram showing a model circuit used for a simulation in order to decide an amplitude value of an optimum external input signal.
Figure 20A:
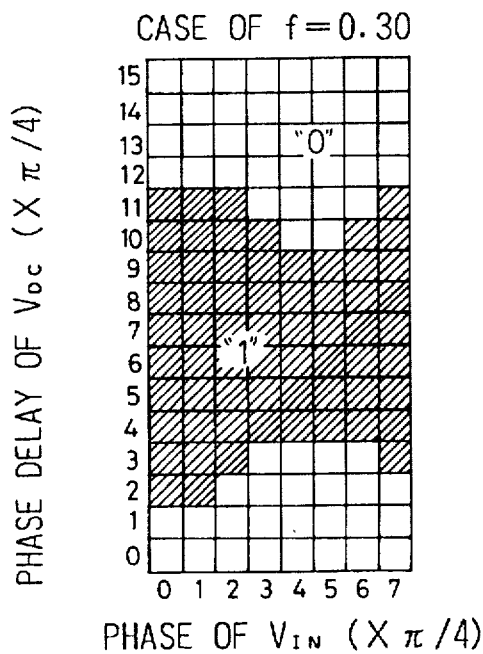
FIGS. 20a to 20d are diagrams showing the simulation result based on the model circuit shown in FIG. 19.
Figure 20B:
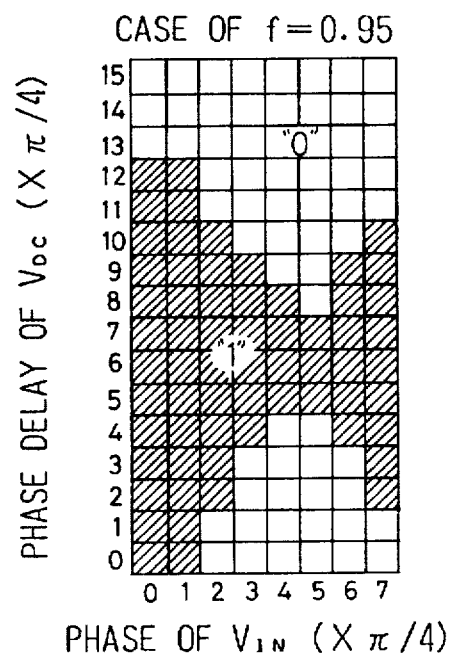
Figure 20C:
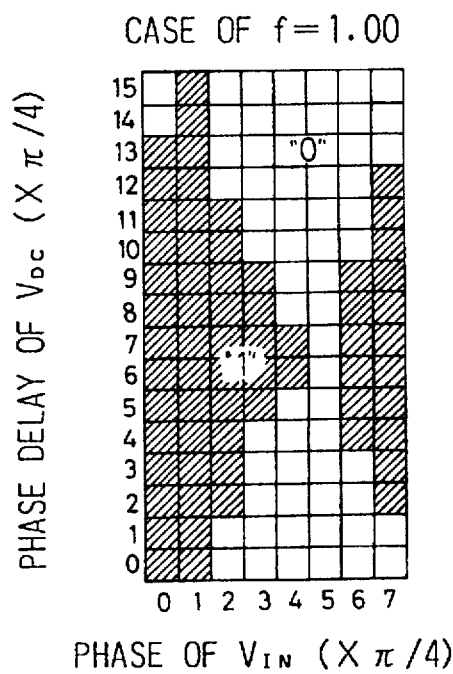
Figure 20D:
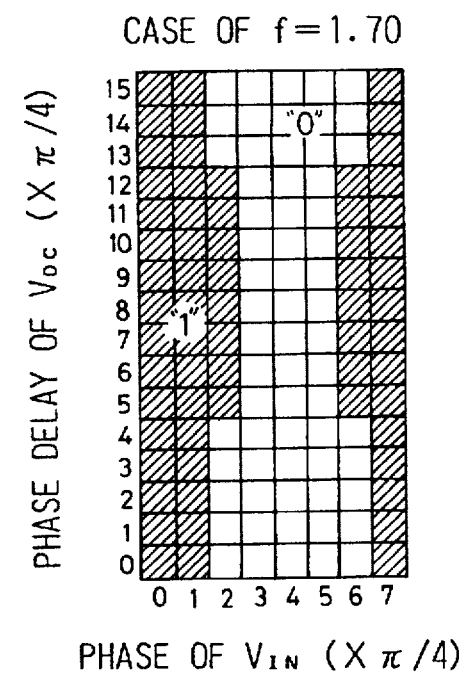

Therefore, to specify these optimum values, the present inventors have carried out simulations by using the model circuits shown in FIGS. 17 and 19, respectively. The simulation results are shown in FIGS. 18a, 18b and 20a to 20d.

FIG. 17 shows the constitution of the model circuit used for the simulation so as to determine the optimum SET junction capacitance, and FIG. 19 shows the constitution of the model circuit used for the simulation so as to determine the amplitude value of the optimum external input signal. Each circuit element shown in FIGS. 17 and 19 is similar to the one shown in FIG. 11.

It can be appreciated from the simulation results shown in FIGS. 18a and 18b that the lower limit of the optimum SET junction capacitance C for controlling the phase state at each gate in the logic network satisfies a value falling within the range of $\epsilon=0.2$ to 0.4. However, the value $\epsilon$ is determined by $C_{in}/C$.

It can also be appreciated from the simulation results shown in FIGS. 20a to 20d that the lower limit of the amplitude value of the optimum external input signal $V_{IN}$ for controlling the phase state at each gate in the logic network satisfies a value falling within the range of f=0.95 to 1.00. However, the value f is determined by $2C/e \times V_{IN0}$ (where $V_{IN0}$ is the maximum value of $V_{IN}$).

The logic network using the SET element according to the embodiment described above is appropriately assembled in order to accomplish a predetermined logical operation function in a computer. In this case, a logic network having various logical operation functions can be constituted by suitably changing the timing at which the power source of each gate is turned ON or the application timing of the external input signal.

According to one of such methods, for example, the external input signal is first applied to the input terminal (the gate of the first stage) of the network, next the power source of each gate of the network is sequentially turned ON from the gates closer to the input terminal, and after the logic information is computed at each gate, propagates inside the network and finally reaches the output terminal of the network, the power sources of all the gates of the network and the external input signal are turned OFF. In this case, the period in which the external input signal is first applied till the power sources of all the gates and the external input signal are finally turned OFF is defined as a cycle of the operation of this network (system).

According to another method, the external input signal is first applied to the input terminal (the gate of the initial stage) of the network, the power source of each gate of the network is then turned ON in an arbitrarily controlled sequence or a random sequence but not simultaneously, and after the power sources of all the gates necessary for at least information processing are turned ON and when the computation result arrives at the output terminal of the network then the power sources of all the gates of the network and the external input signal are turned OFF. In this case, too, the period in which the external input signal is first applied till the power sources of all the gates and the external input signal are turned OFF is defined as a cycle of the operation of this network (system).

According to still another method, the power sources of all the gates of the network are always kept ON, only the external input signal is sequentially switched and applied, and after the logic information is computed at each gate, then propagates inside the network and reaches the output terminal of the network, only the next external input is sequentially switched.

According to still another method, the power sources of all the gates of the network are first turned ON, the external input signal is then applied, and after the logic information is computed at each gate, propagates through the network and reaches the output terminal of the network, the power sources of all the gates of the network and the external input signal are turned OFF. In this case, the period in which the power sources of all the gates are turned ON till the power sources of all the gates and the external input signal are finally turned OFF is defined as a cycle of the operation of this network (system).

Figure 21:
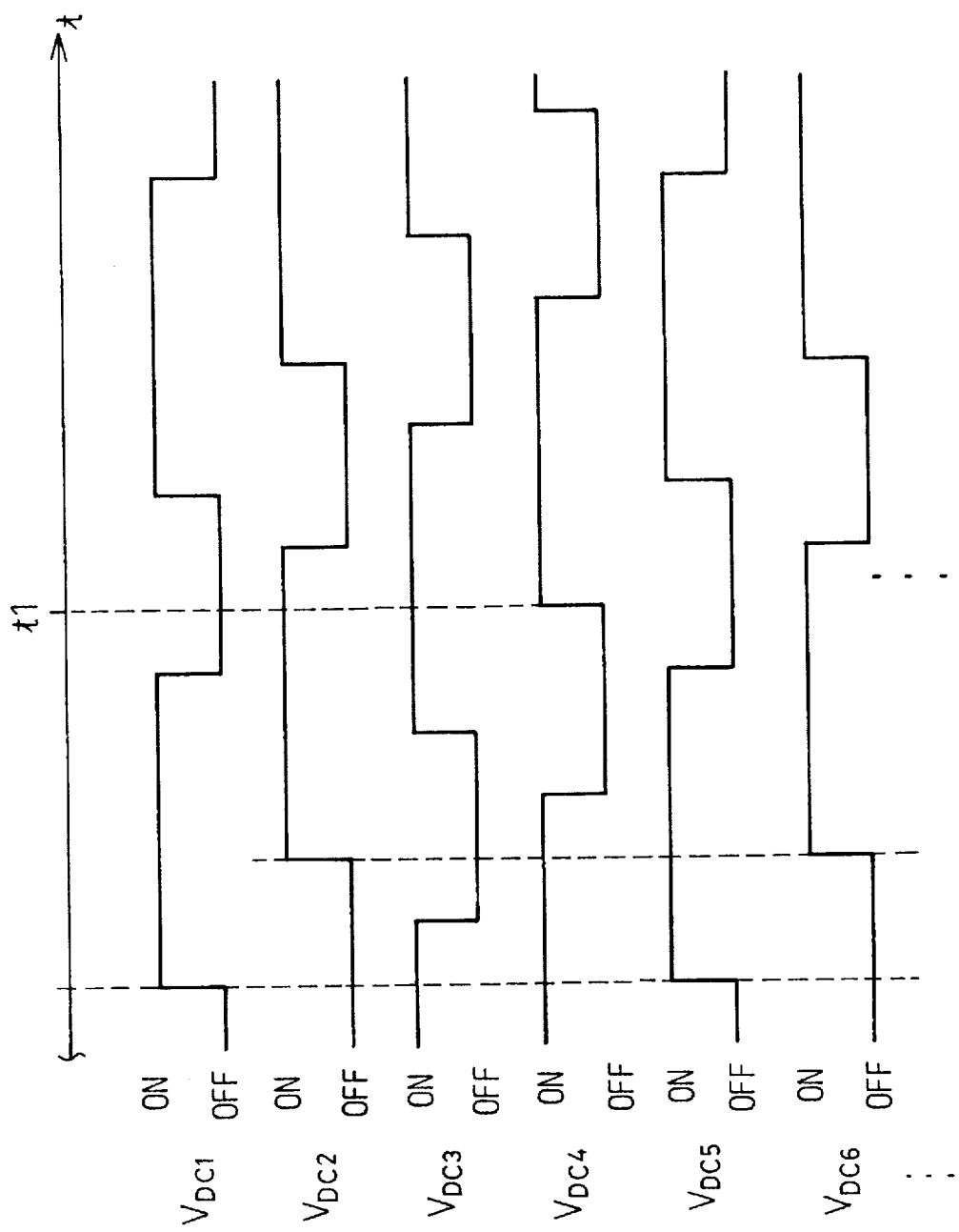
FIG. 21 is a waveform diagram typically showing the application manner of a power supply clock used in a logic network according to the fifth embodiment of the present invention.

FIG. 21 typically shows the application manners of the power source clocks used in the logic network according to the fifth embodiment of the present invention.

The characterizing feature of this embodiment resides in that stability of SET oscillation at each gate is improved by using a four-phase clocking system in place of the conventional three-phase clocking system as means for transmitting the phase information between the gates.

The period in which the power source clocks are applied to specific gates in the four-phase clocking system (that is, the power source ON period) is divided into four periods, that is, the period in which the phase information is inputted, the period in which the phase information is held, the period in which the phase information is transferred to the gate of the next stage, and the period in which the phase information is outputted to the gate of the second downstream stage.

Since the characterizing feature of this embodiment resides in the application manner of the power source clocks on the basis of the four-phase clocking system, the constitution to which such a system is applied is not particularly limited, and the same constitution as that of the fourth embodiment (see FIGS. 14a and 14c), for example, may be employed.

In the waveform diagram shown in FIG. 21, symbols $V_{DC1}$, $V_{DC2}$, $V_{DC3}$, ... denote the power source clocks of the corresponding gates $10_1$, $10_2$, $10_3$ ... (see FIG. 14c). When the timing t1 at which the power source clock $V_{DC4}$ is turned ON, for example, is considered, the power source clocks $V_{DC2}$ and $V_{DC3}$ of the gate of the second upstream stage are both turned ON. Accordingly, all the gates positioned on the second or more upstream stage side from the gate, to which the power source clock $V_{DC4}$ is applied, are under the stable subharmonic phase-locking state.

In other words, because the number of gates on the upstream side under the stable oscillation state increases, stability of SET oscillation (oscillation having the phase information) of each gate can be improved to the extent corresponding to this increase, so that the similar effect to that of the fourth embodiment can be obtained.

It can be estimated from the characterizing feature of the embodiment shown in FIG. 21 that the greater the number of phases of the power source clocks, the higher becomes stability of SET oscillation. However, when the number of phases is excessively great, the drop of the processing capacity at each gate or the increase of power dissipation will be invited. Accordingly, the number of phases of the power source clock must be selected most appropriately in accordance with the intended functions of the logic network assembled into the computer.

What is claimed is:

1. A single-electron tunneling element excited by a pump signal supplied from an alternating current power source, comprising:

at least one tunneling junction with a minute metal-insulator-metal sandwich structure; and a biasing power source which is connected in series to said at least one tunneling junction and whose ON/OFF operation is controlled by an external control input, wherein single-electron tunneling oscillations are generated in said at least one tunneling junction and the generated oscillations are phase-locked to subharmonics of said pump signal to thus exhibit a plurality of stable phase states.

2. The single-electron tunneling element according to claim 1, wherein said biasing power source includes a direct current voltage source and a resistance element connected in series to said at least one tunneling junction.

3. The single-electron tunneling element according to claim 2, wherein said resistance element is composed of a resistor.

4. The single-electron tunneling element according to claim 2, wherein said resistance element is composed of another tunneling junction.

5. The single-electron tunneling element according to claim 2, wherein one of said plurality of stable phase states is determined by applying an input signal with a specified phase to said element.

6. A logic circuit comprising a plurality of single-electron tunneling elements connected in the form of multiple stages and each excited by a pump signal supplied from an alternating current power source, each of said plurality of signal-electron tunneling elements including at least one tunneling junction with a minute metal-insulator-metal sandwich structure, and a biasing power source which is connected in series to said at least one tunneling junction and whose ON/OFF operation is controlled by a corresponding external control input, wherein in each of said plurality of single-electron tunneling elements, single-electron tunneling oscillations are generated in said at least one tunneling junction and the generated oscillations are phase-locked to subharmonics of said pump signal to thus exhibit a plurality of stable phase states, and wherein respective biasing power sources of said plurality of single-electron tunneling elements are sequentially brought to ON state to thus control a logic flow in said logic circuit.

7. The logic circuit according to claim 6, further comprising at least one reactance element for coupling between said plurality of single-electron tunneling elements.

8. The logic circuit according to claim 7, wherein said reactance element is composed of a capacitor.

9. An input/output circuit for interfacing between an external direct current logic signal and an alternating current phase state in an internal logic circuit, said input/output circuit comprising:

a single-electron tunneling element excited by a pump signal supplied from an alternating current power source, and including at least one tunneling junction with a minute metal-insulator-metal sandwich structure, and a biasing power source which is connected in series to said at least one tunneling junction and whose ON/OFF operation is controlled by an external control input, wherein single-electron tunneling oscillations are generated in said at least one tunneling junction and the generated oscillations are phase-locked to subharmonics of said pump signal to thus exhibit a plurality of stable phase states; and at least one phase shifter connected between an output end of said single-electron tunneling element and said internal logic circuit, wherein said at least one phase shifter is bought to an active state based on said external direct current logic signal, to thereby interface between the direct current logic signal and said alternating current phase state.

10. The input/output circuit according to claim 9, wherein said at least one phase shifter includes a delay element which is selectively connected between the output end of said single-electron tunneling element and said internal logic circuit based on said external direct current logic signal.

11. The input/output circuit according to claim 9, further comprising:

at least one tunneling junction excited by the pump signal supplied from said alternating current power source; and a biasing power source connected in series to said at least one tunneling junction, wherein an output signal of said single-electron tunneling element and an alternating current output signal of said internal logic circuit are applied to an end of said at least one tunneling junction, to thereby detect a phase of the alternating current output signal.

12. The input/output circuit according to claim 11, further comprising a coupling reactance element connected between the output end of said single-electron tunneling element and the end of said at least one tunneling junction.

13. A logic network constituted so as to realize a predetermined logic operation in a computer, comprising:

a plurality of gates operatively connected to each other so as to carry out said predetermined logic operation, and each including a single-electron tunneling element; and an alternating current power source which supplies a pump signal for exciting each single-electron tunneling element in said plurality of gates, wherein each single-electron tunneling element in said plurality of gates includes at least one tunneling junction and a biasing power source which is connected in series to said at least one tunneling junction and whose ON/OFF operation is controlled by a corresponding external control input, wherein single-electron tunneling oscillations are generated in said at least one tunneling junction and the generated oscillations are phase-locked to subharmonics of said pump signal to thus exhibit a plurality of stable phase states, and wherein an input signal with a frequency half that of said pump signal is continually applied to a specified gate among said plurality of gates, while the biasing power sources of all of the gates are kept in ON state.

14. The logic network according to claim 13, wherein, in each of said plurality of gates, the corresponding biasing power source includes a direct current voltage source and a resistance element connected in series to said at least one tunneling junction.

15. The logic network according to claim 14, wherein said resistance element is composed of a resistor.

16. The logic network according to claim 14, wherein said resistance element is composed of another tunneling junction.

17. The logic network according to claim 14, wherein each of said plurality of gates includes a coupling capacitor for inputting a signal with phase information.

18. The logic network according to claim 17, wherein, in each of said plurality of gates, a ratio of a capacitance of the corresponding coupling capacitor to a junction capacitance of said tunneling junction is set to a value above a predetermined threshold value.

19. The logic network according to claim 14, wherein an amplitude value of said input signal is set to a value above a predetermined threshold value.

20. The logic network according to claim 13, wherein said input signal is composed of a sine wave signal.

21. The logic network according to claim 13, wherein said input signal is composed of a saw-tooth wave signal.

22. A logic network constituted so as to realize a predetermined logic operation in a computer, comprising:

a plurality of gates operatively connected to each other so as to carry out said predetermined logic operation, and each including a single-electron tunneling element; and an alternating current power source which supplies a pump signal for exciting each single-electron tunneling element in said plurality of gates, wherein each single-electron tunneling element in said plurality of gates includes at least one tunneling junction and a biasing power source which is connected in series to said at least one tunneling junction and whose ON/OFF operation is controlled by a corresponding external control input, wherein single-electron tunneling oscillations are generated in said at least one tunneling junction and the generated oscillations are phase-locked to subharmonics of said pump signal to thus exhibit a plurality of stable phase states, and wherein when the biasing power source of a specified gate among said plurality of gates is switched ON, the biasing power sources of all of a first group of gates providing inputs to said specified gate, and the biasing power sources of all of a second group of gates providing inputs to said first group of gates, are kept in an ON state.

23. The logic network according to claim 22, wherein the biasing power sources of all of gates located in an up-stream side of said second group of gates are further kept in an ON state.

* * * * *

UNITED STATES PATENT AND TRADEMARK OFFICE
CERTIFICATE OF CORRECTION

PATENT NO. : 5,731,717
DATED : Mar. 24, 1998
INVENTOR(S) : OHSHIMA et al.

It is certified that error appears in the above-identified patent and that said Letters Patent is hereby corrected as shown below:

Col. 5, line 40, change "eV" to --eV$_i$--.

Col. 7, line 63, change "GH$_2$" to --GH$_z$--.

Signed and Sealed this

Twenty-third Day of June, 1998

Attest:

BRUCE LEHMAN

*Attesting Officer*     *Commissioner of Patents and Trademarks*